(12) United States Patent
Choi et al.

(10) Patent No.: US 8,247,803 B2
(45) Date of Patent: Aug. 21, 2012

(54) ORGANIC TRANSISTOR INCLUDING AN ORGANIC SEMICNDUCTOR LAYER AND METHOD FOR FABRICATING THE SAME

(75) Inventors: Hyeon Choi, Daejeon (KR); Seok-Hee Yoon, Daejeon (KR); Roman Kiselev, Daejeon (KR)

(73) Assignee: LG Chem, Ltd., Seoul (KR)

( * ) Notice: Subject to any disclaimer, the term of this patent is extended or adjusted under 35 U.S.C. 154(b) by 104 days.

(21) Appl. No.: 12/449,520

(22) PCT Filed: Feb. 13, 2008

(86) PCT No.: PCT/KR2008/000856
§ 371 (c)(1),
(2), (4) Date: Aug. 12, 2009

(87) PCT Pub. No.: WO2008/100084
PCT Pub. Date: Aug. 21, 2008

(65) Prior Publication Data
US 2010/0084637 A1 Apr. 8, 2010

(30) Foreign Application Priority Data
Feb. 13, 2007 (KR) .......... 10-2007-0014882

(51) Int. Cl.
*H01L 51/30* (2006.01)
(52) U.S. Cl. .......... 257/40; 438/99
(58) Field of Classification Search .......... 257/40; 438/99
See application file for complete search history.

(56) References Cited

U.S. PATENT DOCUMENTS

| | | | |
|---|---|---|---|
| 6,150,668 A * | 11/2000 | Bao et al. .......... | 257/40 |
| 6,498,114 B1 | 12/2002 | Amundson et al. | |
| 6,828,582 B1 | 12/2004 | Ando et al. | |
| 7,018,872 B2 * | 3/2006 | Hirai et al. .......... | 438/149 |
| 7,057,206 B2 | 6/2006 | Halik et al. | |
| 7,118,943 B2 | 10/2006 | Yudasaka et al. | |
| 2007/0128764 A1 * | 6/2007 | Tomino et al. .......... | 438/99 |
| 2007/0145359 A1 * | 6/2007 | Che .......... | 257/40 |
| 2009/0152532 A1 | 6/2009 | Takeuchi et al. | |

FOREIGN PATENT DOCUMENTS

| | | |
|---|---|---|
| EP | 1498456 | 1/2005 |
| WO | WO 2006/054709 | 5/2006 |

OTHER PUBLICATIONS

Babel et al. "n-Channel Field-Effect Transistors from Blends of Conjugated Polymers", The Journal of Physical Chemistry B, American Chemical Society. vol. 106, No. 24, Jun. 20, 2002, XP-002664325.

\* cited by examiner

*Primary Examiner* — Marcos D. Pizarro
*Assistant Examiner* — Bilkis Jahan
(74) *Attorney, Agent, or Firm* — McKenna Long & Aldridge LLP

(57) ABSTRACT

The present invention provides an organic transistor that includes an organic semiconductor layer containing a material having conductive particles and an organic semiconductor polymer chemically bonded to each other and a method of producing the same.

11 Claims, 2 Drawing Sheets

[Fig. 1]
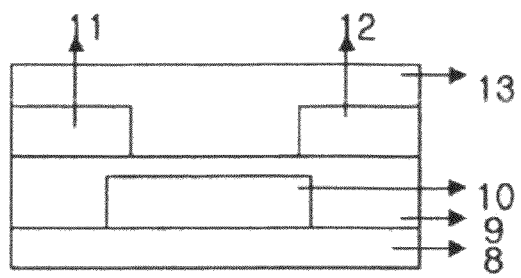
[Fig. 2]
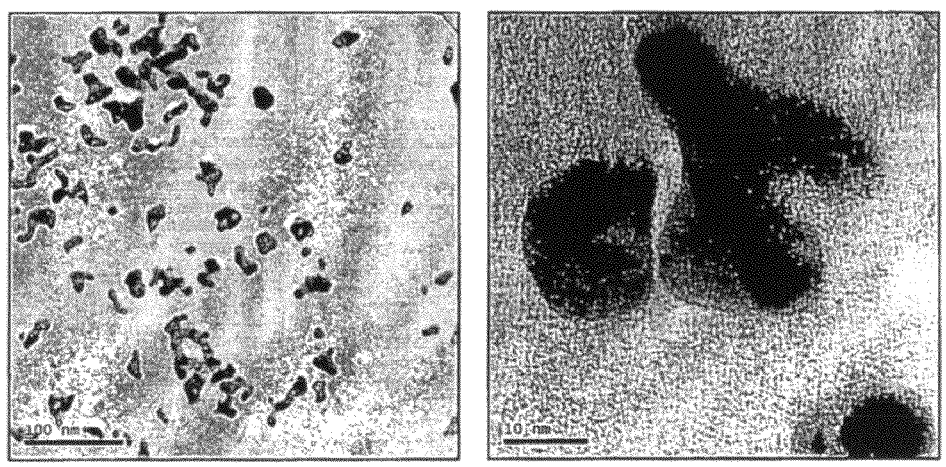
[Fig. 3]
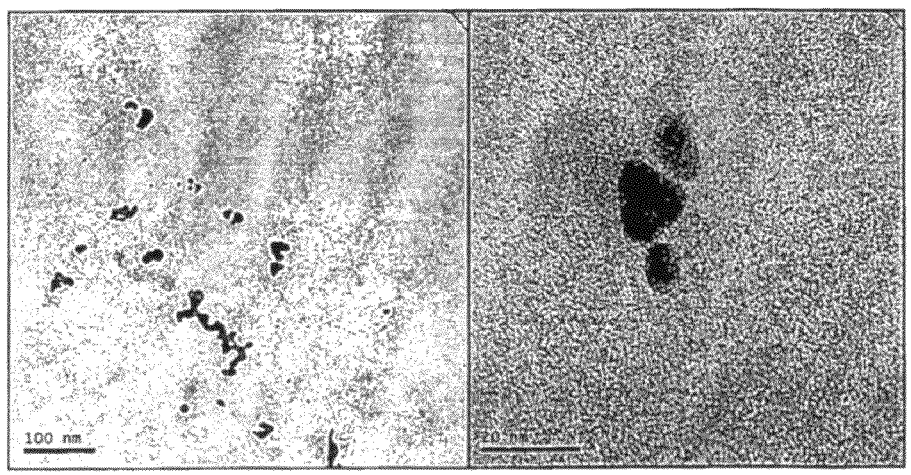

[Fig. 4]
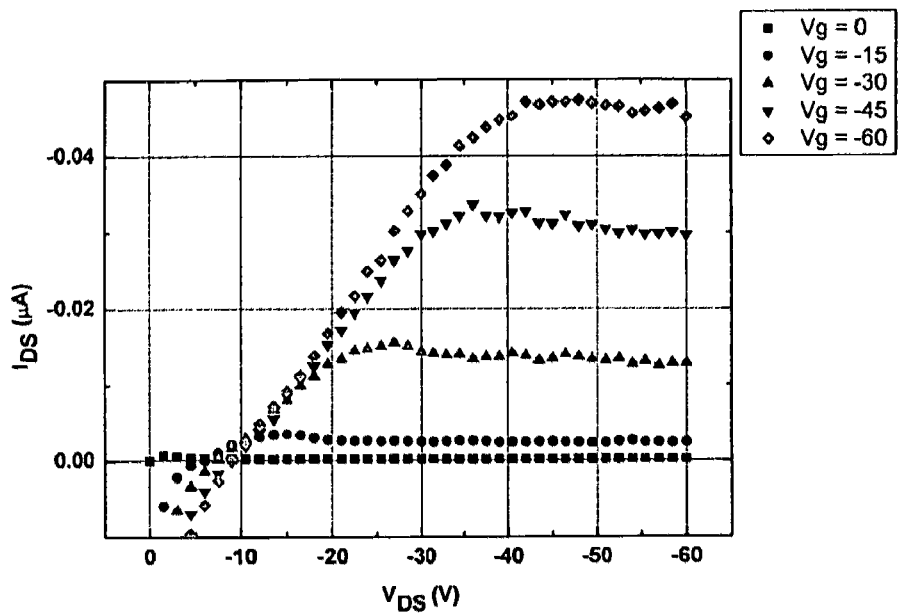
[Fig. 5]
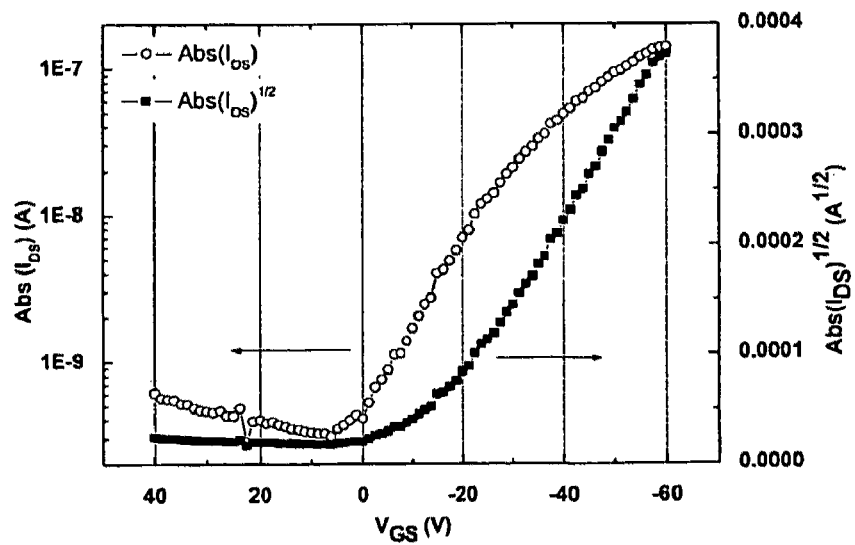

ORGANIC TRANSISTOR INCLUDING AN ORGANIC SEMICNDUCTOR LAYER AND METHOD FOR FABRICATING THE SAME

This application claims the benefit of PCT/KR2008/000856 filed on Feb. 13, 2008 and Korean Patent Application No. 10-2007-0014882 filed on Feb. 13, 2007, both of which are hereby incorporated herein by reference for all purposes in their entirety.

TECHNICAL FIELD

The present invention relates to an organic transistor and a method of producing the same. This application claims priority from Korean Patent Application No. 10-2007-0014882 filed on Feb. 13, 2007 in the Korean Intellectual Property Office, the disclosure of which is incorporated herein by reference in its entirety.

BACKGROUND ART

A thin film type field-effect transistor (FET) is a basic structure in a microelectronic field. The FET includes three electrodes, that is, a source electrode, a drain electrode, and a gate electrode, an insulating layer, and a semiconductor layer. In the case of when the above semiconductor layer is a conductive channel between the two above electrodes, that is, the source electrode and the drain electrode, the FET acts as a capacitor. In the above channel, the concentration of the charge carrier is controlled by using voltage that is applied through the gate electrode. As a result, a flow of electric charges between the source electrode and the drain electrode may be controlled by voltage that is applied through the above gate electrode.

Recently, a concern has been grown rapidly about FETs using an organic semiconductor material. In the case of when the organic semiconductor material is used, electronic devices may be produced by using a printing process such as screen-printing, ink-jet printing, or micro-contact printing. In addition, in the case of when the above material is used, the process may be performed at a very low temperature of the substrate in a state where a vacuum is not required as compared to the case of when a known inorganic semiconductor material is used. Therefore, the electronic device using the organic semiconductor material including FETs may be produced under a very soft production condition at the low cost as compared to the case of when the inorganic semiconductor material is used.

Studies have been conducted to use organic materials such as small molecules, polymers, and oligomers as an organic semiconductor material in FETs since the 1980s. With respect to results of studies in the above-mentioned field, in views of the charge carrier mobility in FETs, performance of the organic FET is increased from $10^{-5}$ cm$^2$/Vs to 1 cm$^2$/Vs (J. M. Shaw, P. F. Seidler, IBM J. Res. & Dev., Vol. 45, 3 (2001)). The performance of the organic transistor is as good as that of a current amorphous silicon transistor. Thus, the organic transistor may be applied to E-papers, smart cards, or display devices.

In order to improve the performance of the organic FET, efforts have been made to mix conductive particles and semiconductor organics with each other. Scientists of AIST in Japan announced test results that when P3HT and Ag nanoparticles were mixed with each other to form a semiconductor layer, an off current was reduced, in other words, the Ag nanoparticles acted as an antioxidant. However, in the above results, since the conductive particles are not present in the conductive channel but between alkyl groups of P3HT, the charge mobility cannot be improved.

DISCLOSURE

Technical Problem

The present inventors have found that in the case of when a material having conductive particles and an organic semiconductor polymer chemically bonded to each other is used as a material of an organic semiconductor layer, an organic transistor can be produced by using a wet process and performance of the produced organic transistor can be improved.

Accordingly, it is an object of the present invention to provide an organic transistor that includes an organic semiconductor layer containing a material having conductive particles and an organic semiconductor polymer chemically bonded to each other and a method of producing the same.

Technical Solution

In order to accomplish the above object, the present invention provides an organic transistor that includes an organic semiconductor layer containing a material having conductive particles and an organic semiconductor polymer chemically bonded to each other.

Furthermore, the present invention provides a method of producing an organic transistor, which includes layering an insulating layer, a gate electrode, a source electrode, a drain electrode, and an organic semiconductor layer on a substrate. The organic semiconductor layer is formed by using a material having conductive particles and an organic semiconductor polymer chemically bonded to each other.

ADVANTAGEOUS EFFECTS

An organic transistor according to the present invention includes an organic semiconductor layer that contains a material having conductive particles and an organic semiconductor polymer chemically bonded to each other. Therefore, it is possible to provide the organic transistor that has excellent performance and is capable of being easily produced by using a wet process.

DESCRIPTION OF DRAWINGS

FIG. 1 illustrates a bottom contact type organic thin film transistor device that includes a substrate 8, an insulating layer 9, a gate electrode 10, a source electrode 11, a drain electrode 12, and an organic semiconductor layer 13;

FIGS. 2 and 3 are pictures of materials that are produced in Examples 2 and 3 by using a transmission microscope; and FIGS. 4 and 5 are characteristic curves of an organic transistor that is produced in Experimental Example 1.

BEST MODE

Hereinafter, the present invention will be described in detail.

An organic transistor according to the present invention is characterized in that the organic transistor includes an organic semiconductor layer containing a material having conductive particles and an organic semiconductor polymer chemically bonded to each other.

In the present invention, examples of the conductive particles include noble metal particles, for example, Au, Ag, and Pt particles, or metal oxide particles, for example, ITO, IZO, and ZnO particles. It is preferable that the particle size of the above conductive particle be in the range of 5 nm to 1 μm. If the particle has the particle size of less than 5 nm, it is difficult to synthesize the particles and to control the particle diameter of the particles. If the particle has the particle size of more than 1 μm, a difference between devices may be increased since it is difficult to statistically control the number of particles in the channel of the organic transistor.

In the present invention, the above organic semiconductor polymer may be represented by the following Formula 1.

B1-X—B2     [Formula 1]

In the above Formula, X is a conductive polymer, and B1 and B2 are end capping functional groups of X and are capable of being chemically bonded to the conductive particles.

According to the present invention, B1 and B2 that are the functional groups provided at X of the above organic semiconductor polymer may be chemically bonded to the conductive particles such as metals or metal oxides to prepare a material that includes the organic semiconductor polymer and the conductive particles chemically bonded to each other and can be used in a solution process, and the material may be used to produce an organic transistor having excellent performance. Specifically, the conductive polymer and the conductive part idles may be bonded to each other by chemical bonding using B1 and B2 that are the end capping functional groups to minimize contact resistance which may occur during movement of electric charges as compared to the case of when the two materials are simply mixed with each other. In addition, the organic semiconductor polymer may be used to ensure the solubility of the above material required in the solution process.

The organic semiconductor polymer of the above Formula 1 may be reacted with the conductive particles such as metals or metal oxides to prepare a material having the above conductive particles and the organic semiconductor polymer chemically bonded to each other. In addition, the metal or metal oxide particle precursor may be mixed with the organic semiconductor polymer that is represented by Formula 1 to prepare a material having the above conductive particles and the organic semiconductor polymer chemically bonded to each other. In connection with this, the metal or metal oxide particle precursor means an ionically bonded compound having metal ions, and examples of the metal or metal oxide particle precursor may include $HAuCl_4$, $AgNO_3$, silver citrate and the like. For example, in order to prepare the material having Au or Ag particles chemically bonded thereto, among the compounds that are represented by Formula 1, the material having —SH as B1 and B2 that are the functional groups is used, the Au or Ag precursor is mixed with the material, and a reducing agent is used to prepare a material having metal particles and an organic semiconductor polymer bonded to each other. During the preparation process, a solvent may be used. In connection with this, a solvent that is capable of desirably dissolving the organic semiconductor polymer may be used as the above solvent, and it is preferable to use a solvent having chlorine such as chlorobenzene and chloroform.

It is preferable that the above organic semiconductor polymer and the conductive particles be contained in the organic semiconductor layer of the organic transistor according to the present invention at a weight ratio of 10:1 to 1:10,000. More preferably, the organic semiconductor polymer and the conductive particles are contained at a weight ratio of 10:1 to 1:10. If the weight ratio is less than 10:1, since the amount of the conductive particles is reduced, the effect of the present invention is reduced. If the weight ratio is more than 1:10,000, it is difficult to perform the solution process due to the aggregation between the conductive particles.

In the present invention, it is preferable that the organic semiconductor layer including the material having the above conductive particles and the organic semiconductor polymer chemically bonded to each other have a thickness in the range of 10 nm to 1 μm. If the thickness is less than 10 nm, the charge conductive layer formed to have a thickness of 5 nm or less is easily degraded due to moisture or oxygen. If the thickness is more than 1 μm, there is a problem in that an on/off ratio is reduced.

In the present invention, X which is the above conductive polymer is not limited, but a polymer that includes thiophene, aniline, pyrrole or the like may be used. It is preferable to use the conductive polymer that is capable of preparing a solution having a concentration of 0.1 wt % or more in respects to the solvent that is used to form the organic semiconductor layer of the organic transistor, and it is more preferable to use the conductive polymer that is capable of preparing a solution having a concentration of 1 wt % or more. Any solvent that is known in the art may be used as the solvent that is used to form the above organic semiconductor layer. For example, as described above, the solvent that contains chlorine may be used, but the solvent of the present invention is not limited thereto.

It is preferable that the above conductive polymer have a molecular weight of 3,000 or more. More preferably, the molecular weight is 5,000 or more. In the case of when the conductive polymer having the molecular weight of 3,000 or more is used, it is possible to obtain the desirable solubility in respects to the solvent. Thus, it is easy to perform the process.

For example, B1 and B2 may be groups containing —SH in the case of when the conductive particles are noble metal particles such as Au or Ag particles, or may be groups containing a phosphate group in the case of when the conductive particles are metal oxide particles, for example, ITO, IZO, and ZnO particles.

In the above Formula 1, X may include a structural unit that is represented by the following Formula 2.

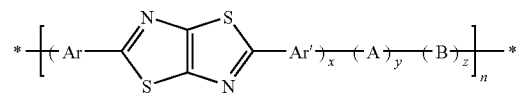

[Formula 2]

In the above Formula 2, x, y, and z are a ratio of the structural units, x is a real number with $0<x\leqq1$, y is a real number with $0\leqq y<1$, z is a real number with $0\leqq z<1$, and $x+y+z=1$, n is an integer in the range of 5 to 1,000, and more preferably an integer in the range of 10 to 1,000, Ar and Ar' are the same as or different from each other, and are independently a bivalent cyclic or non-cyclic hydrocarbon group having a conjugated structure, or a bivalent heterocyclic group having a conjugated structure, A and B are the same as or different from each other, and are independently a bivalent cyclic or non-cyclic hydrocarbon group having a conjugated structure, a bivalent heterocyclic group having a conjugated structure, or an acyclic group as follows:

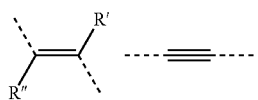

In the above Formulae, R' and R" are the same as or different from each other, and may be independently a hydrogen atom; a halogen atom; a linear, branched, or cyclic alkyl group; a linear, branched, or cyclic alkoxy group; a thioalkoxy group; a nitrile group; a nitro group; an amino group; a substituted or unsubstituted aryl group, or a substituted or unsubstituted heteroaryl group, and the dotted line is a portion linked to a main chain of Formula 2.

In the above Formula 2, Ar and Ar' may be an arylene group or heteroarylene group having a conjugated structure.

In the above Formula 2, it is preferable that A or B be an aromatic group (Ar").

As an example of A or B, the above aromatic group (Ar") is an arylene group or a heteroarylene group, and preferably a group that is represented by the following Formulae.

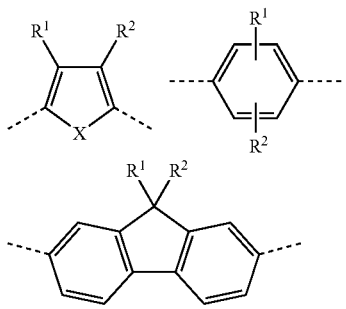

In the above Formulae, X is an O, S, Se, $NR^3$, $SiR^3R^4$, or $CR^3R^4$ group, and $R^3$ and $R^4$ are the same as or different from each other, are independently a hydrogen atom; a linear, branched, or cyclic alkyl group; or an aryl group, and may be bonded to each other to form a ring, $R^1$ and $R^2$ are the same as or different from each other, and are independently a hydrogen atom, a hydroxyl group, a halogen atom, a nitrite group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group, two or more carbon atoms which are contained in $R^1$ and/or $R^2$ and are not adjacent to each other may be linked by O, S, NH, —$NR^O$—, —$SiR^OR^{OO}$—, —CO—, —COO—, —OCO—, —OCOO—, —S—CO—, —CO—S—, —CH=CH—, a substituted or unsubstituted aryl group, or a substituted or unsubstituted heteroaryl group, $R^O$ and $R^{OO}$ are the same as or different from each other, and are independently hydrogen, an aryl group, or an alkyl group having 1 to 12 carbon atoms, and $R^1$ and $R^2$ may be bonded to each other to form a ring.

In the above Formulae, in the case of when $R^1$ or $R^2$ is a substituted alkyl, alkoxy, or thioalkoxy group having 1 to 20 carbon atoms, the hydrogen atom bonded thereto can be substituted with at least one substituent group of fluorine, chlorine, bromine, iodine, and nitrile.

In the above Formulae, in the case of when $R^1$ or $R^2$ is a substituted aryl or heteroaryl group, it can be substituted with at least one substituent group of a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, and a silane group.

Examples of Ar, Ar' and Ar" in the above Formulae will be listed as follows. However, these examples are for the illustrative purpose only, and the invention is not intended to be limited thereto.

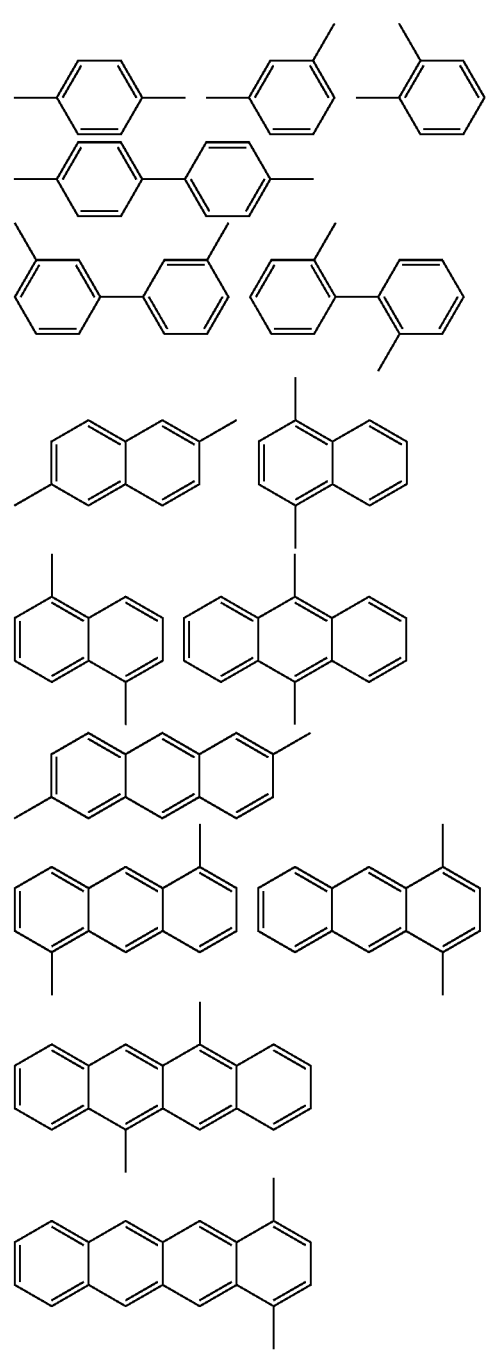

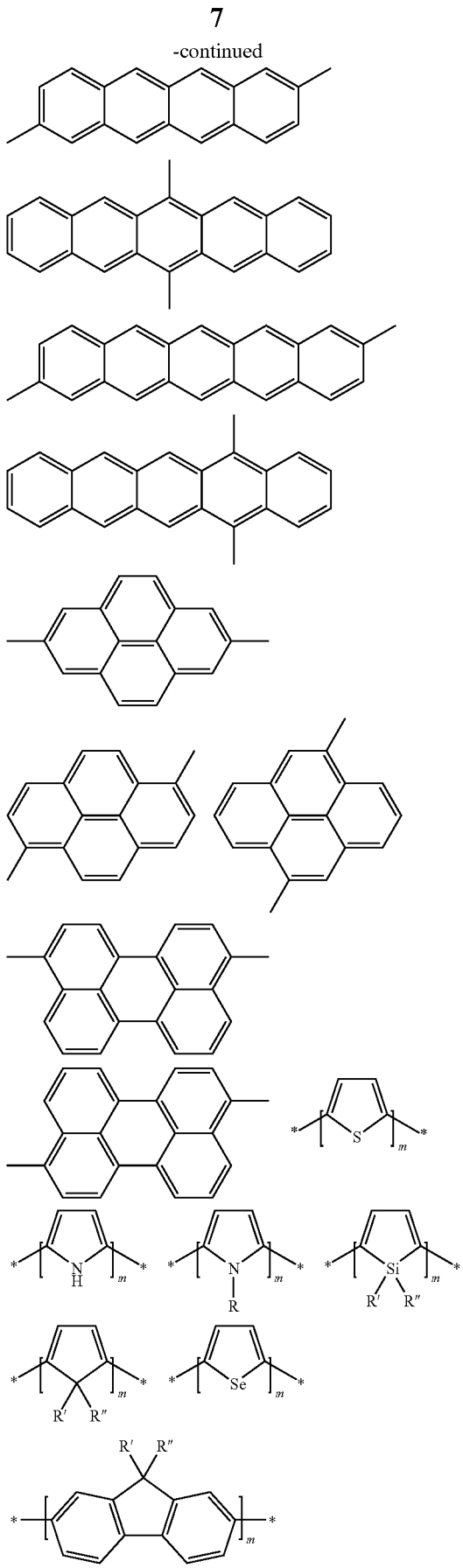

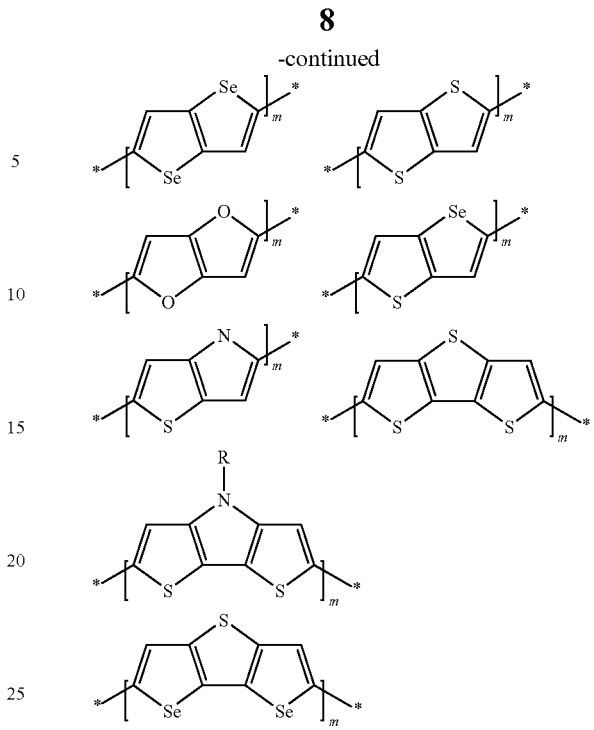

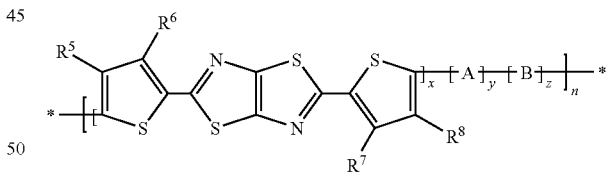

In the above Formulae, the position, at which no substituent is presented, may be a hydrogen atom, and may be substituted with at least one of a halogen group, an alkyl group, an alkoxy group, a thioalkoxy group, an aryl group, an amino group, a nitrile group, a nitro group, an ester group, an ether group, an amide group, an amide group, an imide group, a hetero group, a vinyl group, an acetylene group, a silane group, or the like, R, R' and R" are the same as or different from each other and are independently a hydrogen atom, an alkyl group, or an aryl group, and m is an integer in the range of 1 to 10 and more preferably an integer in the range of 1 to 6.

The compound that is represented by the above Formula 2 may contain a structural unit of the following Formula 3.

[Formula 3]

In the above Formula 3, $R^5$ to $R^8$ are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group, two or more carbon atoms which are contained in $R^5$ to $R^8$ and are not adjacent to each other may be linked by O, S, NH, —NR$^O$—, SiR$^O$R$^{OO}$—, —CO—, —COO—, —OCO—, —OCOO—, —S—CO—, —CO—S—, —CH=CH—, a substituted or unsubstituted aryl group, or a substituted or unsubstituted heteroaryl group, R$^O$ and R$^{OO}$ are the same as or different from each other, and are independently hydrogen, an aryl group, or an alkyl group having 1 to 12 carbon atoms, R$^5$ and R$^6$ or R$^7$ and R$^8$ may be bonded to each other to form a ring, and n, x, y, z, A, and B are as defined by Formula 2.

In the above Formula 3, in the case of when at least one of R$^5$ to R$^8$ is a substituted alkyl, alkoxy, or thioalkoxy group, the hydrogen atom substituted thereto can be substituted with at least one group of fluorine, chlorine, bromine, iodine, and nitrile.

In the above Formula 3, in the case of when at least one of R$^5$ to R$^8$ is a substituted aryl or heteroaryl group, it can be substituted with at least one of a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, and a silane group.

In the preferred embodiment of the present invention, specific examples of the above Formula 2 are represented by the following Formulae. However, these examples are for the illustrative purpose only, and the invention is not intended to be limited thereto.

Formula R-1

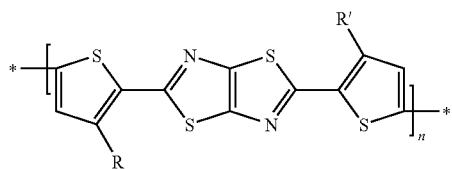

Formula R-2

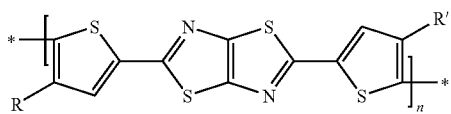

Formula S-1

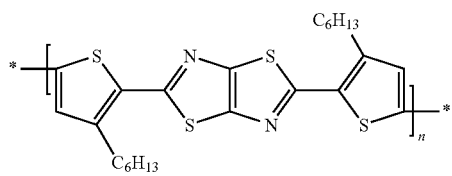

Formula S-2

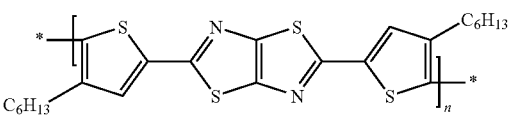

Formula S-3

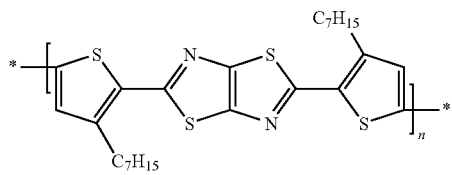

Formula S-4

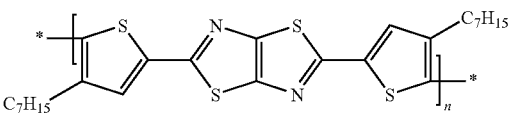

Formula S-5

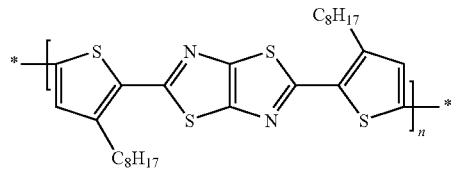

Formula S-6

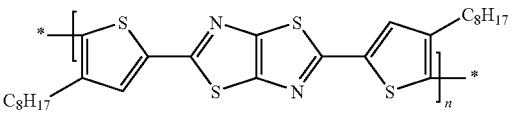

Formula S-7

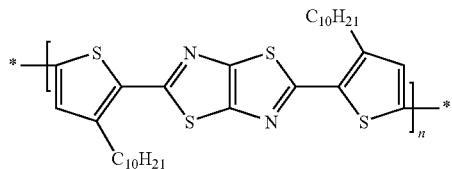

Formula S-8

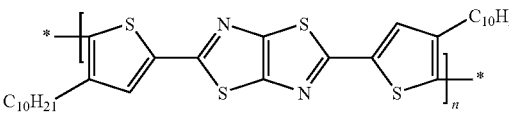

Formula S-9

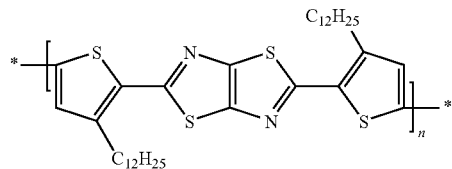

Formula S-10

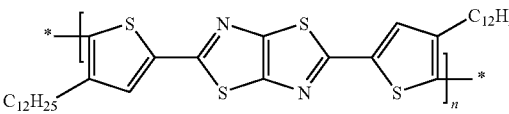

-continued
Formula R-3
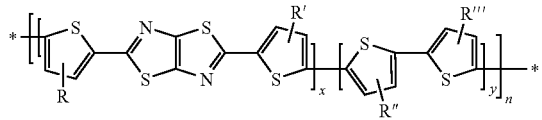
Formula S-11
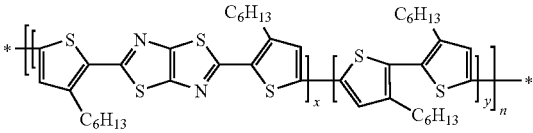
Formula S-12
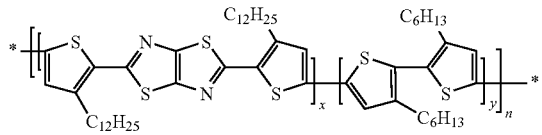
Formula S-13
Formula S-14
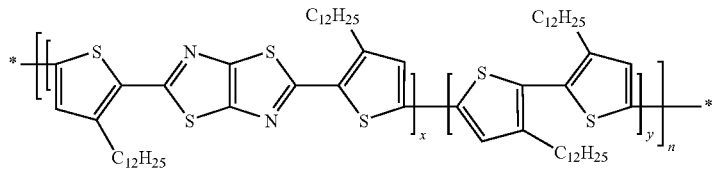
Formula R-4
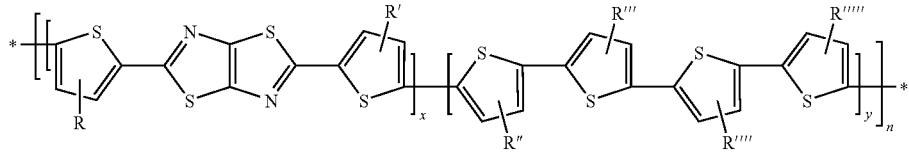
Formula S-15
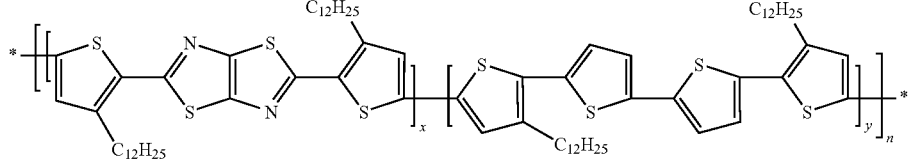
Formula S-16
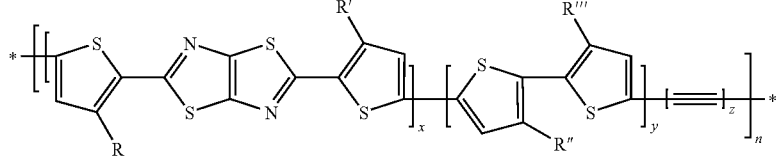
Formula S-17
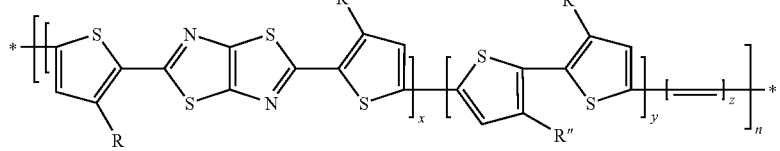
Formula S-18
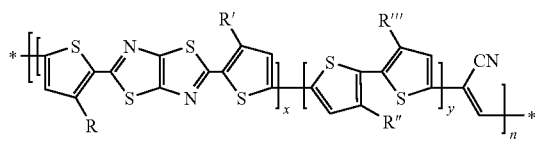
Formula S-19
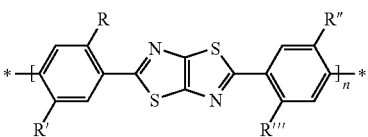
Formula S-20
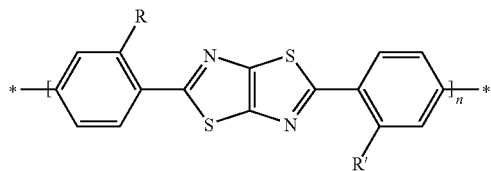
Formula S-21
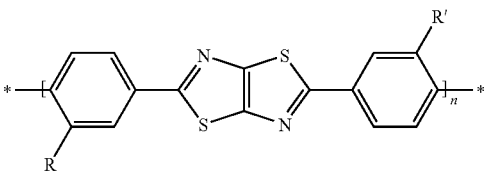

Formula S-22
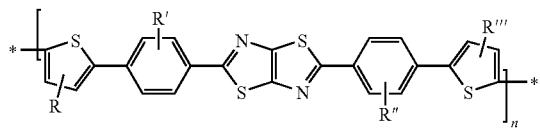
Formula S-23
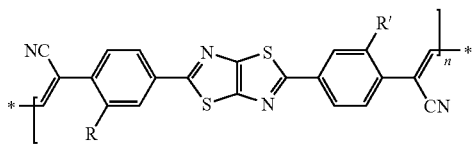
Formula S-24
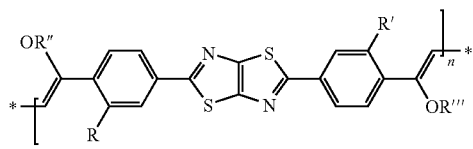
Formula S-25
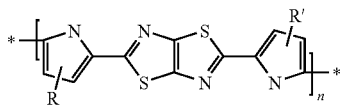
Formula S-26
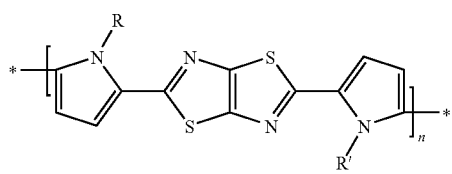
Formula S-27
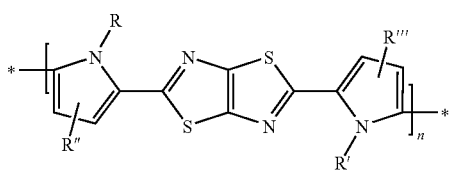
Formula S-28
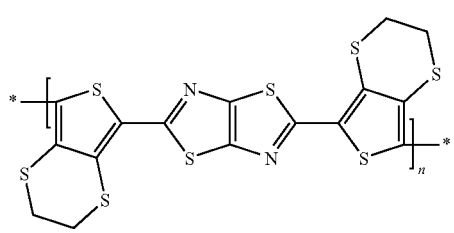
Formula S-29
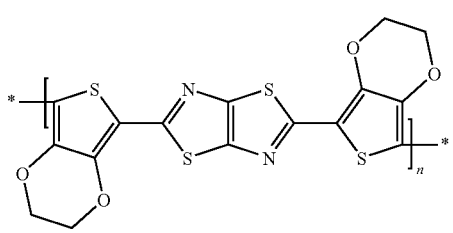
Formula S-30
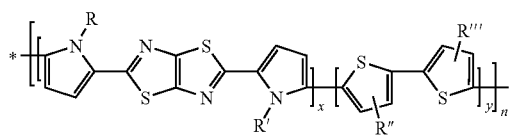
Formula S-31
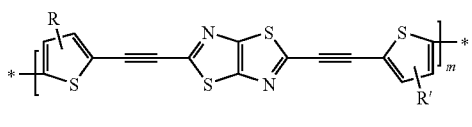
Formula R-5
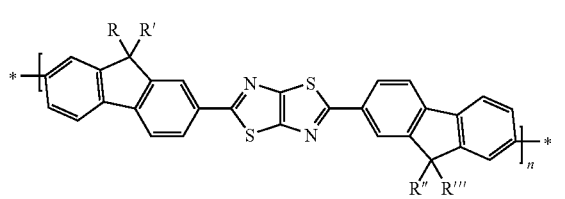
Formula S-32
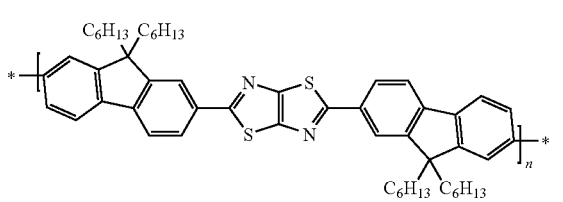
Formula S-33
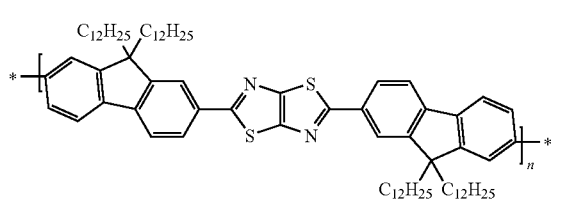
Formula S-34
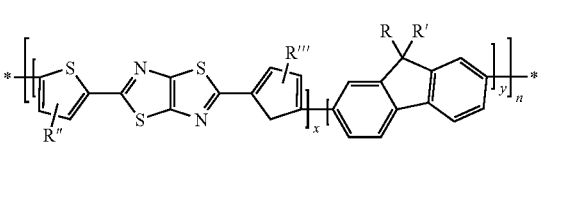
Formula S-35
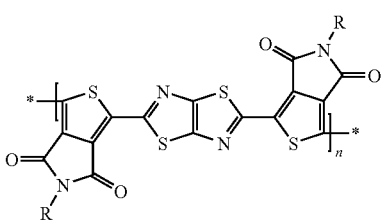
Formula S-36
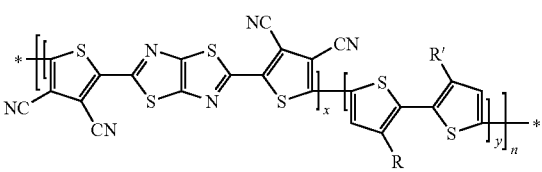

Formula S-37
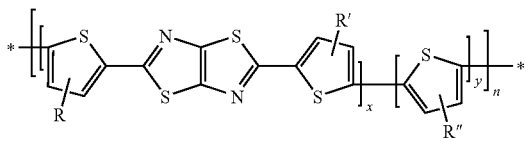

Formula S-38
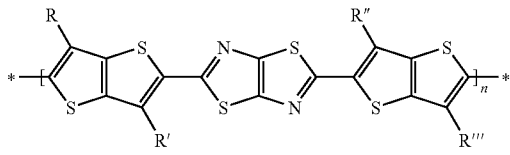

Formula S-39
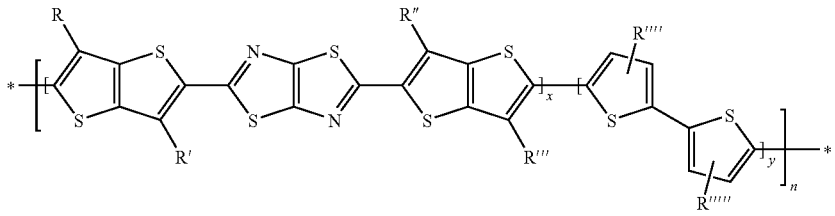

Formula S-40
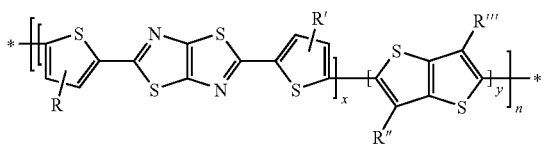

Formula S-41 wherein R to R'''' contained in the above Formulae R-1 to R-5 and S-1 to S-41 are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group. They may be bonded to each other to form a ring, and n, x, and y are as defined by Formula 2.

In the organic transistor according to the present invention, the above organic semiconductor layer may be produced by preparing the solution of the material having the conductive particles and the organic semiconductor polymer chemically bonded to each other and performing a printing process such as screen printing, inkjet printing, or microcontact printing.

The organic transistor according to the present invention may be produced by using a method and a material that are known in the art, except that the organic semiconductor layer is formed by using the above-mentioned material.

For example, the organic transistor according to the present invention can be prepared by layering an insulating layer 9, a gate electrode 10, a source electrode 11, a drain electrode 12, and an organic semiconductor layer 13 on a substrate 8 according to a PVD (physical vapor deposition) process such as sputtering or e-beam evaporation or a solution coating process, but the scope of the present invention is not limited thereto. In connection with this, the above organic semiconductor layer may be formed to have a single layer structure or a multi layered structure.

[Mode For Invention]

Hereinafter, the present invention will be described in detail with reference to Examples. Examples are provided only for the purpose of illustrating the present invention, and accordingly it is not intended that the present invention is limited thereto.

EXAMPLE

Preparation Example

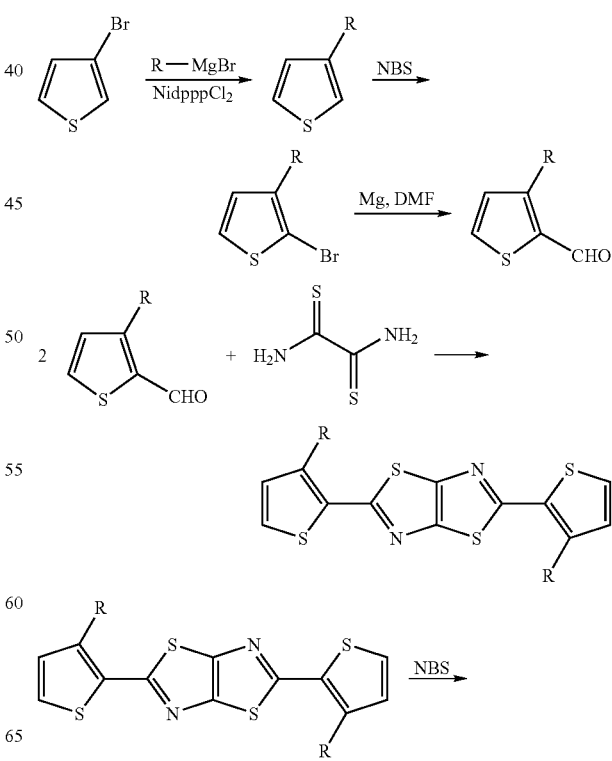

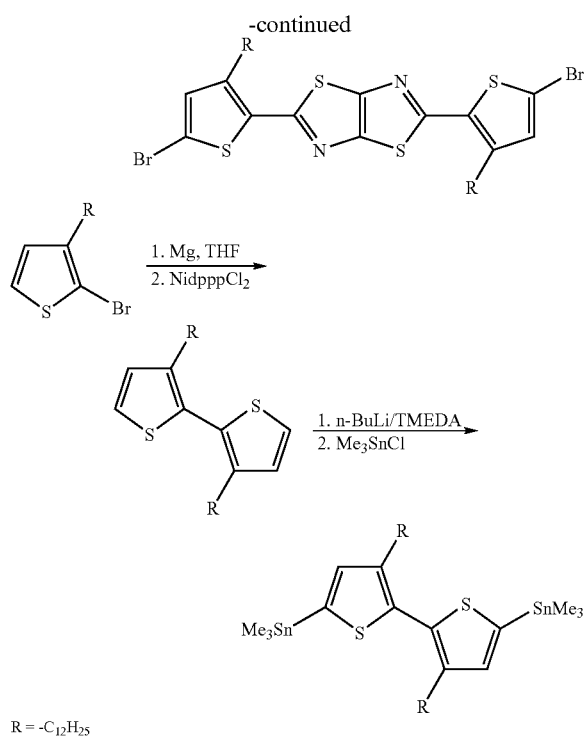

R = -C$_{12}$H$_{25}$

Synthesis of 3-dodecylthiophene

Dried ethyl ether (40 ml) was added to activated magnesium (1.22 g; 50 mmol), and 1-bromododecane (12.46 g; 50 mmol) was added thereto to prepare a Grignard reagent. Then, Ni(dppp)Cl$_2$ (33 mg) was added thereto, and 3-bromothiophene (8 g; 49 mmol) dissolved in 10 ml of ether was slowly added dropwise. The reaction solution was refluxed for one day, and then a mixture of 2N HCl/ice (50 ml) was added to terminate the reaction. The resultant was extracted by using ethyl ether, and the solvent was distilled off under reduced pressure. The residue was dissolved in DMF (50 ml) and filtered to remove remaining paraffin. The filtrate was concentrated, and then the residue was distilled off under vacuum to obtain a colorless liquid of 3-dodecylthiophene (10.5 g; 85%).

Synthesis of 2-bromo-3-dodecylthiophene

A solution of N-bromosuccinimide (NBS) (48 g; 0.27 mol) dissolved in DMF (160 ml) was slowly added to a solution of 3-dodecylthiophene (68 g; 0.27 mol) dissolved in DMF (110 ml). After the reaction solution was stirred for one day, 750 ml of water was added thereto. An organic material was extracted by using ethyl ether (3×300 ml), and washed with brine and water, and then the residual moisture was removed over anhydrous magnesium sulfate. After removing the solvent, the residue was distilled off under reduced pressure at 125° C./~5 mmHg to obtain a product (84.85 g, yield of 94%).

Synthesis of 3-dodecylthiophene-2-carboaldehyde

After magnesium (0.63 g; 25.8 mmol) and anhydrous THF (25 ml) were put into a flask, 2-bromo-3-dodecylthiophene (7.78 g; 23.5 mmol) was slowly added thereto. After starting Grignard reaction, the solution was refluxed until magnesium was almost removed. The purified DMF (3.65 g; ~4 ml; 50 mmol) was slowly added dropwise to the reaction solution. The reaction solution was refluxed for one day, and cooled to 0° C., and 5% HCl (100 ml) was added thereto to terminate the reaction. An organic layer was extracted by using ethyl ether, and the obtained organic layer was washed sequentially with NaHCO$_3$, a saturated NaCl aqueous solution, and water. The residual moisture was removed over anhydrous magnesium sulfate. After removing the solvent, the residue was subjected to a column separation process by using silica gel (ethyl acetate/hexane=1/9) to obtain 3-dodecylthiophene-2-carboaldehyde (3.6 g; 55%).

Synthesis of 5,5'-bis(3-dodecyl-2-thienyl)-thiazolothiazole 3-dodecylthiophene-2-carboaldehyde (3.9 g; 14 mmol) and dithiooxamide (0.8 g; 6.6 mmol) were put into a flask, heated at 180° C. for one hour, and then cooled to room temperature. Chloroform was added thereto, and stirring and filtering were performed. The obtained material was recrystallized by using hexane three times, and further recrystallized by using acetone/ethyl acetate to obtain a product (1.5 g; 35%) having a purity of 99.57% (the purity measured by HPLC). The melting point of the material was 60° C.

Synthesis of 2,2'-bis(bromo)-5,5'-bis(3-dodecyl-2-thienyl)-thiazolothiazole

After shielding light, a NBS (0.28 g, 1.57 mmol) solution dissolved in a mixture of chloroform/acetic acid (20/10 ml) was slowly added dropwise to 5,5'-bis(3-dodecyl-2-thienyl)-thiazolothiazole (0.5 g, 0.78 mmol) dissolved in a CHCl$_3$/AcOH mixture (20/10 ml) at 0° C. The reaction solution was stirred at the same temperature for 2 hours, and then stirred at room temperature for one day. The reaction solution was washed with water, and treated with anhydrous magnesium sulfate. The resultant was recrystallized by using an acetone/hexane (1:1) solvent to obtain 2,2'-bis(bromo)-5,5'-bis(3-dodecyl-2-thienyl)-thiazolothiazole (0.6 g, 96% of yield).

Synthesis of 5,5'-bis(3-dodecyl)-2,2'-dithiophene

Under nitrogen atmosphere, 2-bromo-3-dodecylthiophene (6.0 g, 18 mmol) was added dropwise to 35 ml of a THF solution, in which magnesium (0.22 g, 9 mmol) was dispersed. After preparing a Grignard reagent, the reaction solution was cooled to room temperature. Pd(dppp)Cl$_2$((1,3-bis[diphenylphosphino]propane)dichloronickel (II) bisdiphenylphosphospinoethanedichloronickel) (0.2 g, 0.4 mmol) and 15 ml of anhydrous THF were added thereto, and the reflux was performed for 24 hours. After terminating the reaction with a 5% HCl aqueous solution, the resultant was diluted with ethyl ether, and washed with water, and moisture was removed over anhydrous magnesium sulfate. After removing the solvent, the residue was subjected to a column purification process with n-hexane on silica gel to obtain 5,5'-bis(3-dodecyl)-2,2'-dithiophene (2.5 g; 54% of yield).

Synthesis of 2,2'-bis(trimethylstenyl)5,5'-bis(3-dodecyl-2-thienyl)

5,5'-bis(3-dodecyl)-2,2'-dithiophene (14.3 g; 28.4 mmol) and TMEDA (13 ml; 85.3 mmol) were dissolved in 350 ml of dried hexane, and the 2.5 M n-BuLi (2.5 M in hexane) solution (30 ml; 71 mmol) was slowly added thereto dropwise at −78° C. The temperature of the reaction solution was increased to 0° C., the solution was stirred for one hour, and the cooling was performed so that the temperature was reduced to −78° C. Trimethyltin chloride (17 g; 85.3 mmol) that was diluted in 30 ml of hexane was added thereto, the temperature of the reaction solution was increased to normal temperature, and the stirring was performed for a day. The reaction solution was diluted by using hexane, and washed with water, and moisture was removed by using anhydrous magnesium sulfate. After pressure was reduced to remove the solvent, the residue (~24 g) was recrystallized by using ethanol/acetone (350 ml/100 ml) and additionally recrystallized by using ethanol (600 ml) to obtain a pure product (21.4 g; yield: 91%).

Example 1

Synthesis of Thiophenol-End Capped poly(tetra(dodecylthiophene)thiazolothiazole) (Polymer 1)

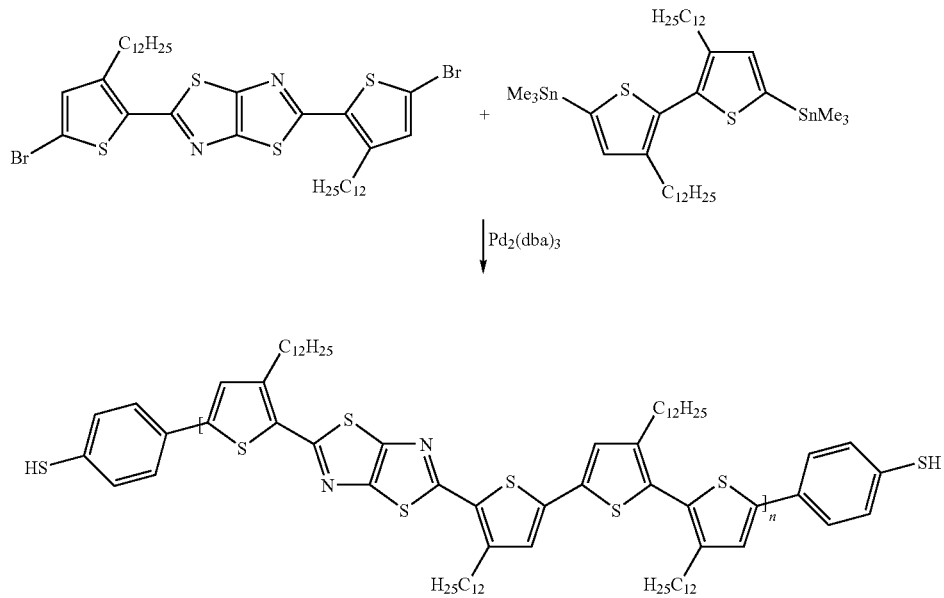

The magnetic bar, 2,2'-bis(5-bromo-3-dodecylthio-thienyl)thiazolothiazole (0.80089 g; 1 mmol), 2,2'-bis(trimethylstenyl)-5,5'-bis(3-dodecyl-2-thienyl) (0.92791 g; 1.12 mmol), tris(dibenzylideneacetone) dipalladium (4.6 mg; 0.5 mol %), tri(o-tolyl)phosphine (12.1 g; 4.5 mol %), and o-dichlorobenzene (5 ml) were put into a glass for microwave reactors, the reaction was performed at 180° C. for 10 min, and the resultant was cooled to 50° C. 4-bromothiophenol (0.2 g; 1 mmol) that was dissolved in 0.4 ml of o-dichlorobenzene was added thereto, and the reaction solution was reacted at 180° C. for 120 sec. After the reaction, the resulting solution was cooled to 50° C., and added to a solvent mixture of methanol and a 37% hydrochloric acid (10:1) to obtain a product. After the drying in a vacuum, the polymer and N,N-diethylphenylazothioformamide (150 mg) were dissolved in chloroform (120 ml), and stirred in a nitrogen atmosphere for 2 hours to remove metal. After pressure was reduced to obtain a solid, a Soxhlet purification process was performed by sequentially using methanol, acetone, hexane, and methylene chloride to obtain a product.

Example 2

Synthesis of poly(tetra(dodecylthiophene)thiazolothiazole)-gold Nanoparticles (Polymer:Au=2:1)

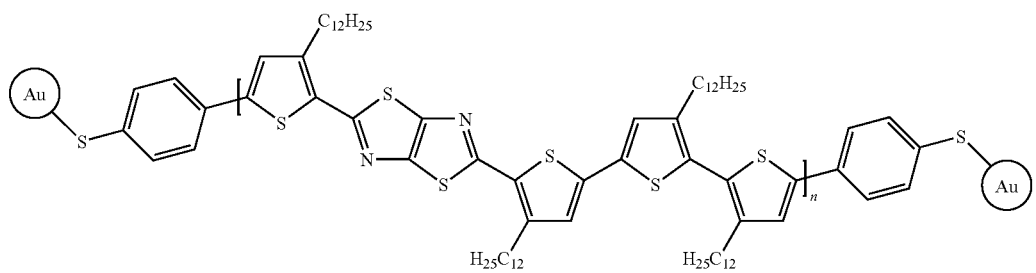

The solution of $HAuCl_4$ (50 mg) that was dissolved in chloroform (2 ml) and the solution of the polymer 1 (100 mg of the polymer 1 was dissolved in 20 ml of chloroform) were mixed with each other in the dry box. The reaction solution was stirred at normal temperature for one hour, and the lithium triethyl borohydride (1.0 M in THF) solution was added thereto until the gas was not generated any more. After the reaction solution was strongly stirred in an argon atmosphere at normal temperature for an additional period of time of 2 hours, the reaction solution was precipitated in ethanol. The obtained solid was subjected to a Sohxlet process by using acetone to perform the purification, and then subjected to vacuum drying to obtain a dark red product.

Example 3

Synthesis of poly(tetra(dodecylthiophene)thiazolothiazole)-gold Nanoparticles (Polymer:Au=10:1)

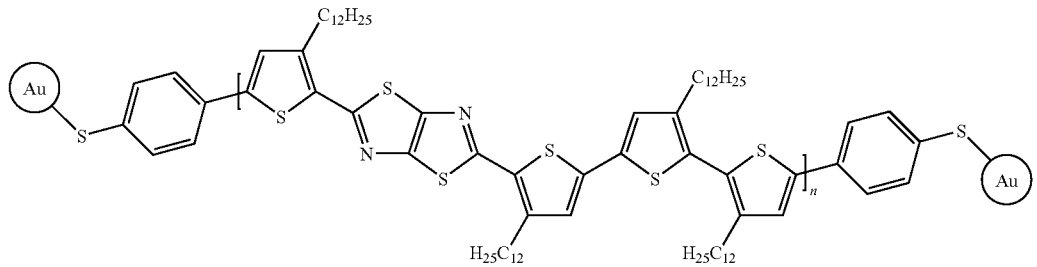

The solution of HAuCl$_4$ (10 mg) that was dissolved in chloroform (2 ml) and the solution of the polymer 1 (100 mg of the polymer 1 was dissolved in 20 ml of chloroform) were mixed with each other in the dry box. The reaction solution was stirred at normal temperature for one hour, and the lithium triethyl borohydride (1.0 M in THF) solution was added thereto until the gas was not generated any more. After the reaction solution was strongly stirred in an argon atmosphere at normal temperature for an additional period of time of 2 hours, the reaction solution was precipitated in ethanol. The obtained solid was subjected to a Sohxlet process by using acetone to perform the purification, and then subjected to vacuum drying to obtain a dark red product (97 mg; yield of 94%).

The materials of the above Examples 2 and 3 were observed by using a transmission electron microscope (TEM). In result, as shown in FIGS. 2 and 3, the Au nanoparticle had the size of about 10 nm. In addition, it could be seen that the number and the size of the particles were controlled as the amount of the Au precursor was reduced.

Experimental Example 1

The organic transistor that had the structure shown in FIG. 1 was produced. The n-dopped silicon wafer was used as the substrate and the gate electrode, and silicon oxide (300 nm) that was grown and formed by using heat treatment was used as the gate insulating layer thereon. The source electrode and the drain electrode that were made of gold were formed on the gate insulating layer by using an e-beam. The substrate thus prepared was treated by using HMDS (hexamethyldisilazane). The solution of the material that was prepared in Example 3 and dissolved in chlorobenzene in an amount of 0.1 w/v % was applied on the substrate on which the source electrode and the drain electrode were formed by using spin coating at a rate of 500 rpm for 30 sec, subjected to preannealing at 70° C., and subjected to heat treatment at 100° C. for 1 hour to form an organic semiconductor layer. In connection with this, the width and the length of the channel of the organic transistor were 300 μm and 10 μm, respectively.

The results of the above transistor are shown in FIGS. 4 and 5. In result, the charge mobility of the transistor was $3.5 \times 10^{-4}$ cm$^2$/V.s and the on/off ratio thereof was $10^3$ in a saturation region.

The invention claimed is:
1. An organic transistor comprising:
an organic semiconductor layer that contains a material having conductive particles and an organic semiconductor polymer chemically bonded to each other,
wherein the organic semiconductor polymer is a material of the following Formula 1:

B1—X—B2    [Formula 1]

wherein X is a conductive polymer, and B1 and B2 are end capping functional groups of X and are capable of being chemically bonded to the conductive particles, and B1 and B2 are groups that include a —SH or phosphate group;

wherein the conductive polymer X includes a structural unit that is represented by the following Formula 2:

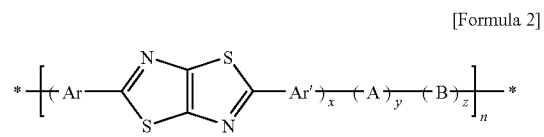

[Formula 2]

wherein x, y, and z are a ratio of structural units, x is a real number with $0<x\leq1$, y is a real number with $0\leq y<1$, z is a real number with $0\leq z<1$, and $x+y+z=1$, wherein n is an integer in the range of 5 to 1,000, wherein Ar and Ar' are the same as or different from each other, are independently a bivalent cyclic hydrocarbon group having a conjugated structure, or a bivalent heterocyclic group having a conjugated structure, and are each independently selected from the following Formulae:

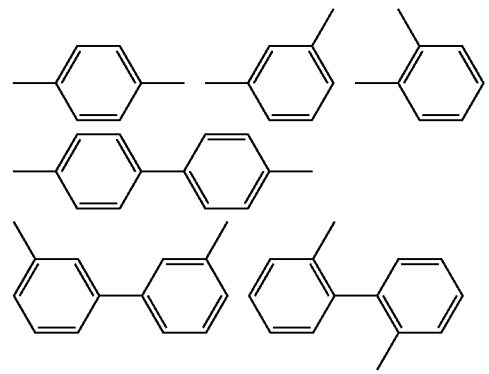

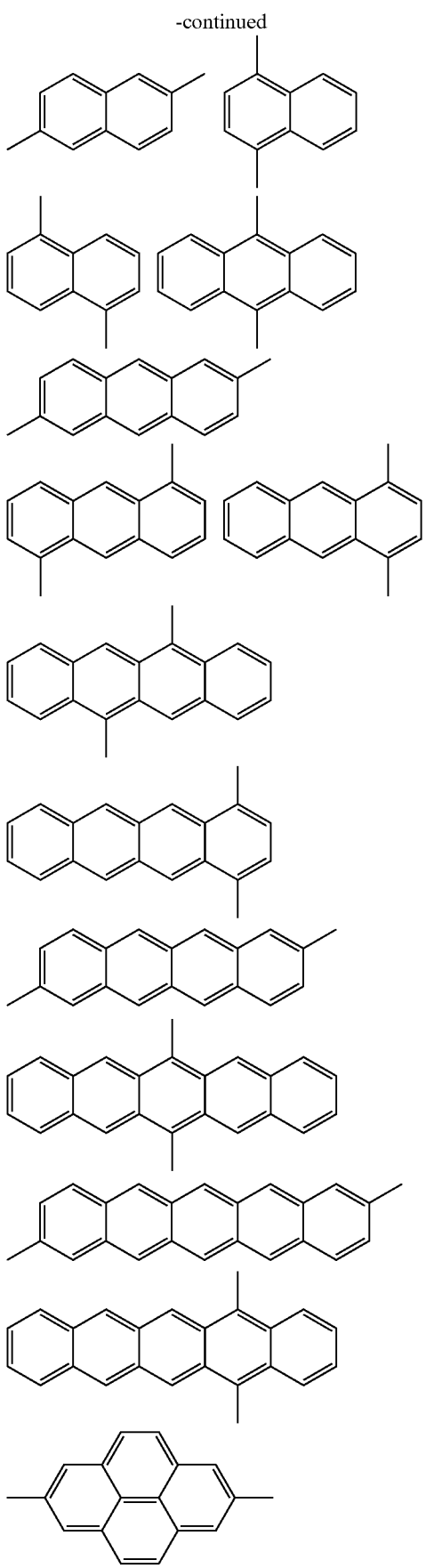
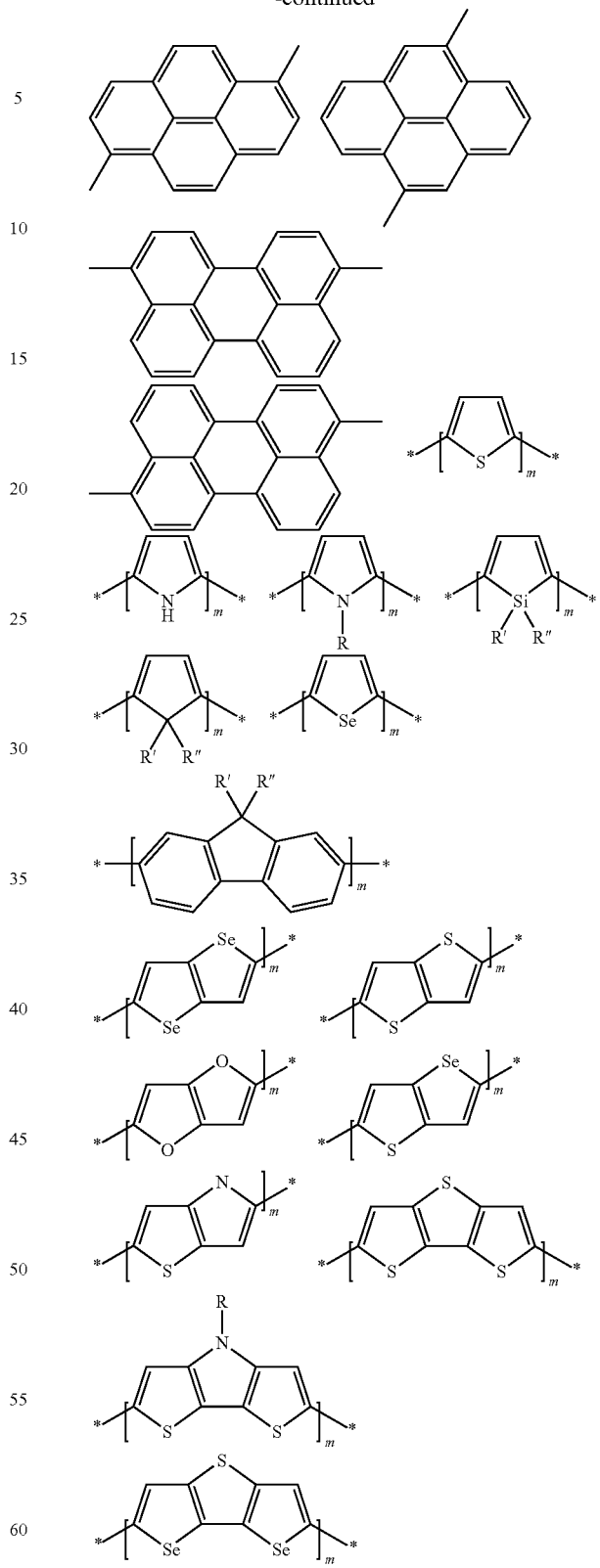
wherein the position, at which no substituent is presented, is a hydrogen atom, or has a substituent group selected from a halogen group, an alkyl group, an alkoxy group, a thioalkoxy group, an aryl group, an amino group, a hetero group, a vinyl group, an acetylene group, and a silane group, R, R' and R" are the same as or different from each other and are independently a hydrogen atom, an alkyl group, or an aryl group, and m is an integer in the range of 1 to 10; and wherein A and B are the same as or different from each other, and are independently a bivalent cyclic or non-cyclic hydrocarbon group having a conjugated structure, a bivalent heterocyclic group having a conjugated structure, or an acyclic group as follows:

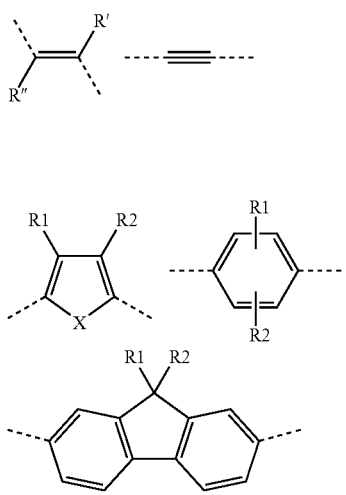

wherein X is an O, S, Se, NR$^3$, SiR$^3$R$^4$, or CR$^3$R$^4$ group, and R$^3$ and R$^4$ are the same as or different from each other, are independently a hydrogen atom; a linear, branched, or cyclic alkyl group; or an aryl group, and are optionally bonded to each other to form a ring, wherein R$^1$ and R$^2$ are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted arylgroup, or a substituted or unsubstituted heteroaryl group, wherein two or more carbon atoms which are contained in R$^1$ and/or R$^2$ and are not adjacent to each other are optionally linked by O, S, NH, —NR$^0$—, SiR$^0$R$^{00}$—, —CO—, —COO—, —OCO—, —OCOO—, —S—CO—, —CO—S—, —CH=CH—, a substituted or unsubstituted aryl group, or a substituted or unsubstituted heteroaryl group, R$^0$ and R$^{00}$ are the same as or different from each other, and are independently hydrogen, an aryl group, or an alkyl group having 1 to 12 carbon atoms, wherein R$^1$ and R$^2$ are optionally bonded to each other to form a ring, and wherein R' and R" are the same as or different from each other, and are independently a hydrogen atom; a halogen atom; a linear, branched, or cyclic alkyl group; a linear, branched, or cyclic alkoxy group; a thioalkoxy group; a nitrile group; a nitro group; an amino group; a substituted or unsubstituted aryl group; or a substituted or unsubstituted heteroaryl group, and a dotted line is a portion linked to a main chain of Formula 2.

2. The organic transistor as set forth in claim 1, wherein the conductive particles are metal or metal oxide particles.

3. The organic transistor as set forth in claim 2, wherein the conductive particles include one or more of Au, Ag, Pt, ITO, IZO, and ZnO.

4. The organic transistor as set forth in claim 1, wherein each of the conductive particles has a particle size in the range of 5 nm to 1 μm.

5. The organic transistor as set forth in claim 1, wherein X is the conductive polymer that includes one or more of thiophene, aniline, and pyrrole.

6. The organic transistor as set forth in claim 1, wherein the conductive polymer X can be used to prepare a solution having a concentration of 0.1 wt % or more in respects to a solvent used to form an organic semiconductor layer.

7. The organic transistor as set forth in claim 1, wherein the organic semiconductor polymer has a molecular weight of 3,000 or more.

8. The organic transistor as set forth in claim 1, wherein A and B are each independently selected from the following Formulae:

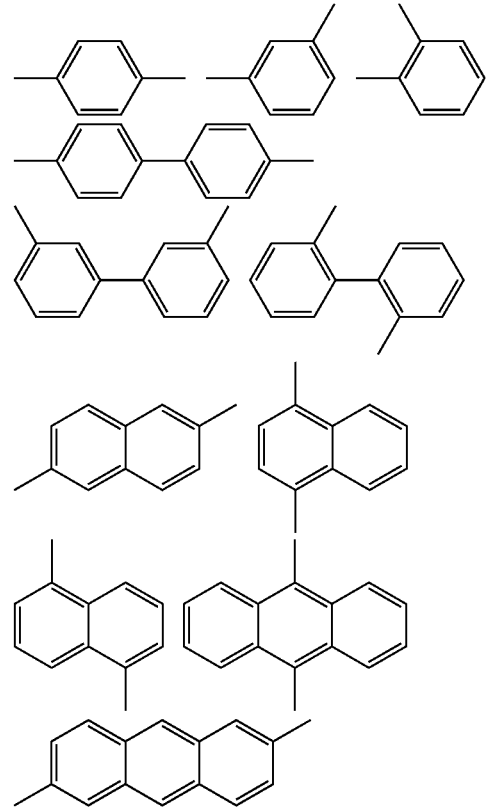

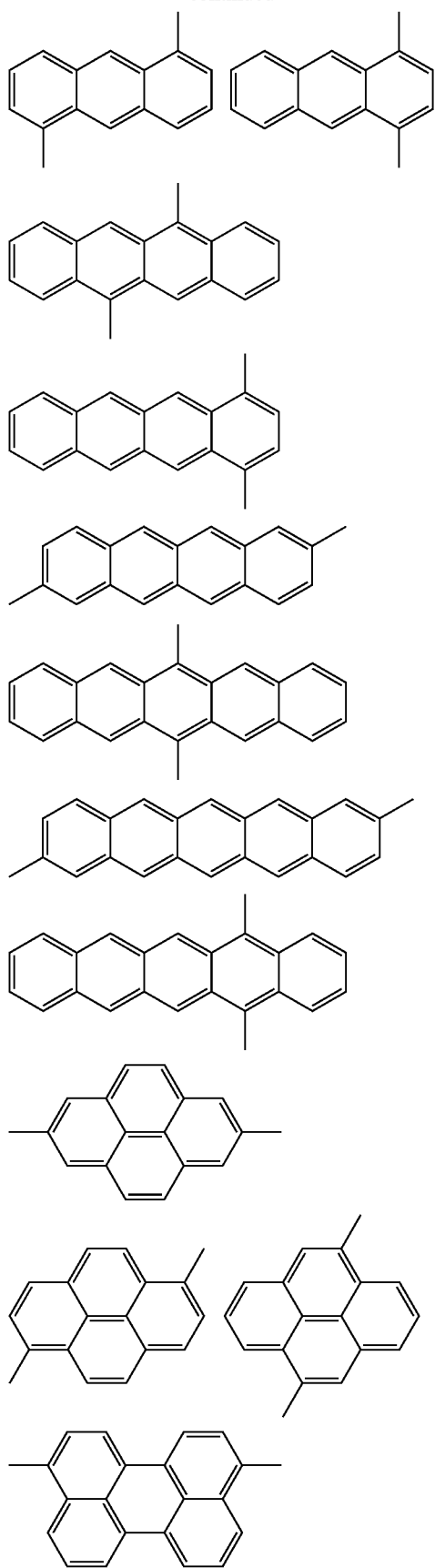
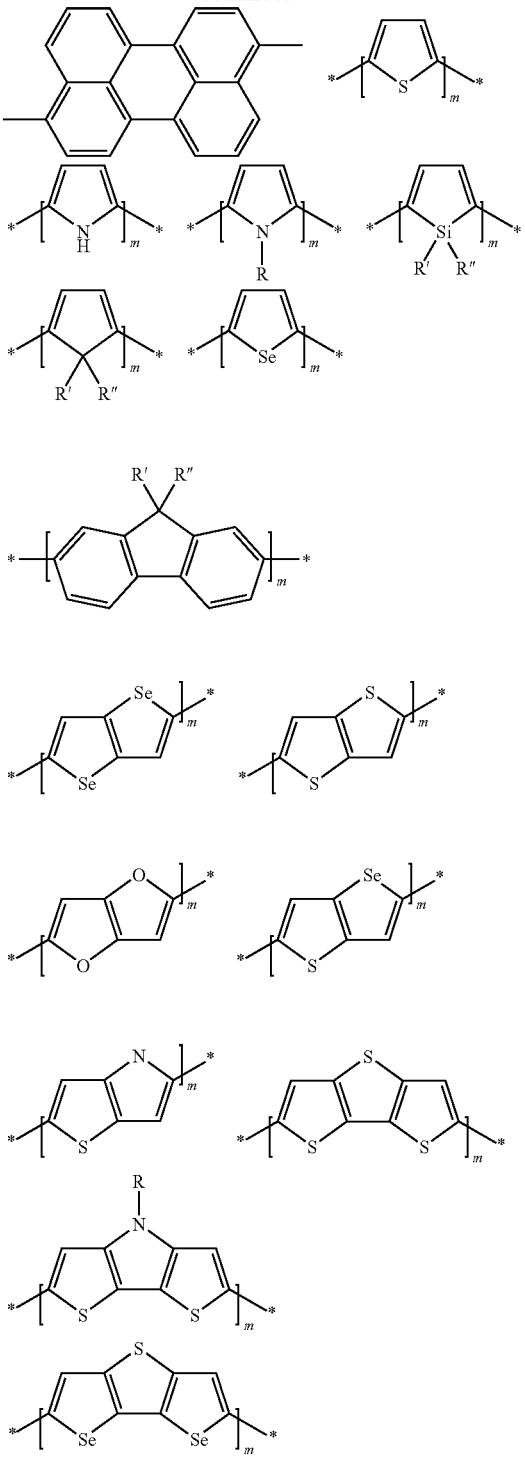

wherein the position, at which no substituent is presented, is a hydrogen atom, or has a substituent group selected from a halogen group, an alkyl group, an alkoxy group, a thioalkoxy group, an aryl group, an amino group, a hetero group, a vinyl group, an acetylene group, and a silane group, R, R' and R" are the same as or different from each other and are independently a hydrogen atom, an alkyl group, or an aryl group, and m is an integer in the range of 1 to 10.

9. The organic transistor as set forth in claim 1, wherein the following Formula 2 is represented by the following Formula 3:

[Formula 3]

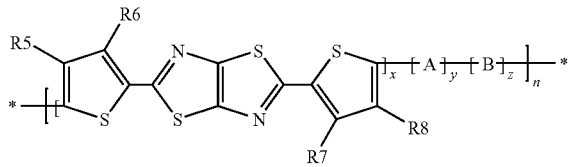

wherein $R^5$ to $R^8$ are the same as or different from each other, and are independently a hydrogen atom, a hydroxyl group, a halogen atom, a nitrile group, a nitro group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group, two or more carbon atoms which are contained in $R^5$ to $R^8$ and are not adjacent to each other are optionally linked by O, S, NH, —$NR^O$—, $SiROR^{OO}$—, —CO—, —COO—, —OCO—, —OCOO—, —S—CO—, —CO—S—, —CH=CH—, a substituted or unsubstituted aryl group, or a substituted or unsubstituted heteroaryl group, $R^O$ and $R^{OO}$ are the same as or different from each other, and are independently hydrogen, an aryl group, or an alkyl group having 1 to 12 carbon atoms, $R^5$ and $R^6$ or $R^7$ and $R^8$ are optionally bonded to each other to form a ring, and n, x, y, z, A, and B are as defined by Formula 2.

10. The organic transistor as set forth in claim 1, wherein the above Formula 2 is selected from the following Formulae R-1 to R-5, S-16 to S-31, and S-34 to S-41:

Formula R-1

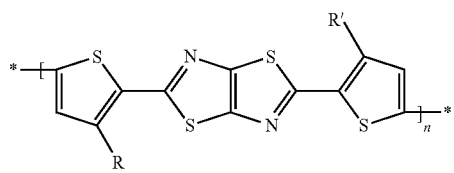

Formula R-2

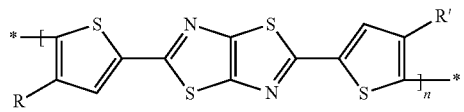

Formula R-3

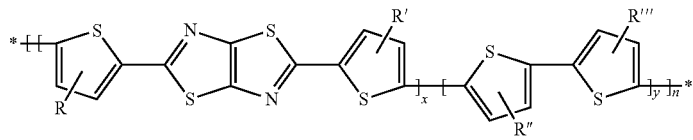

Formula R-4

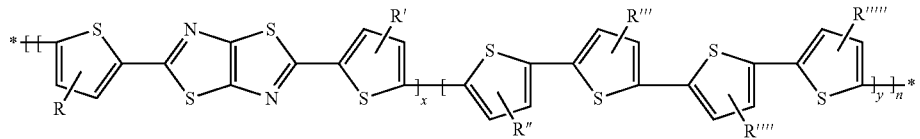

Formula R-5

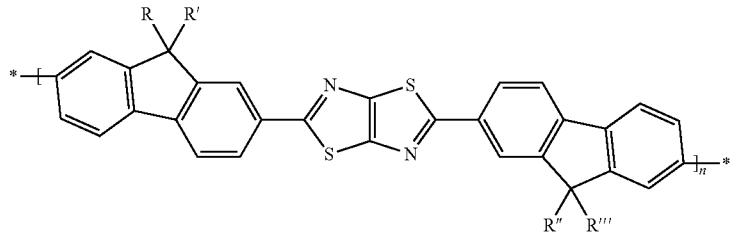

Formula S-16

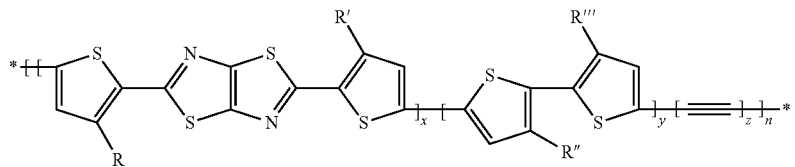

-continued
Formula S-17
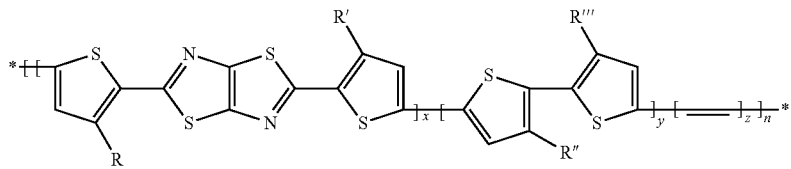
Formula S-18
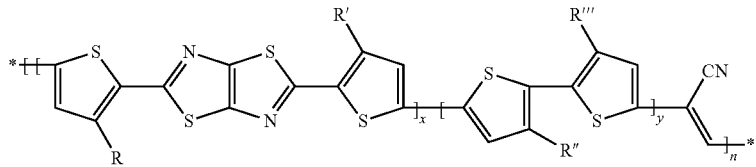
Formula S-19
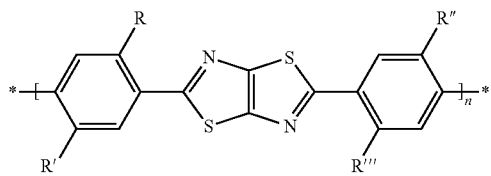
Formula S-20
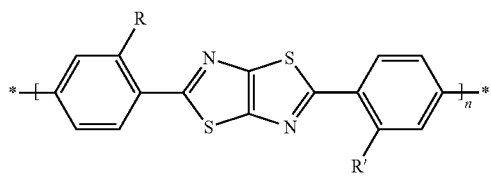
Formula S-21
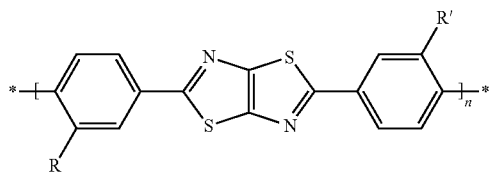
Formula S-22
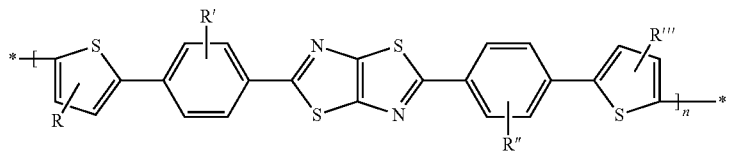
Formula S-23
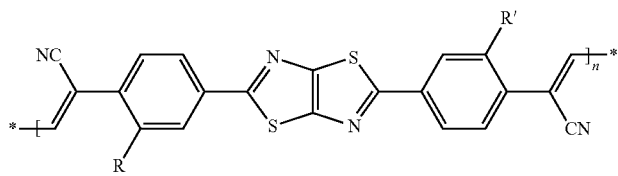
Formula S-24
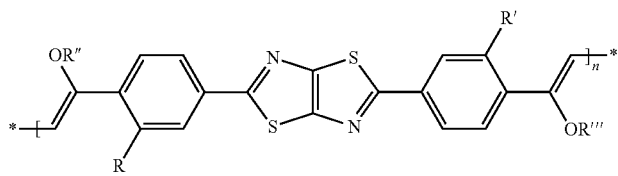
Formula S-25
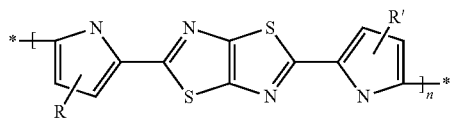

-continued
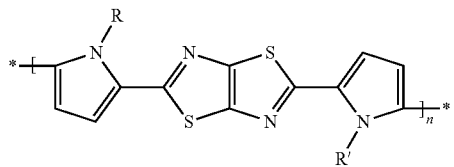
Formula S-26
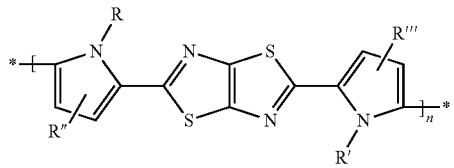
Formula S-27
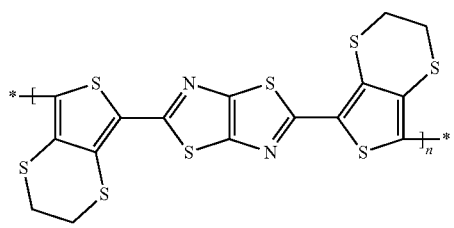
Formula S-28
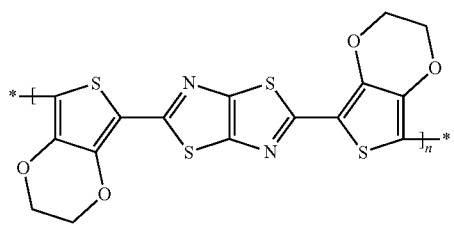
Formula S-29
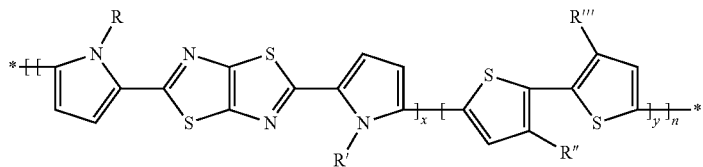
Formula S-30
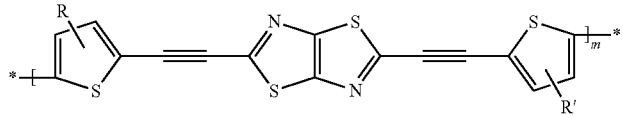
Formula S-31
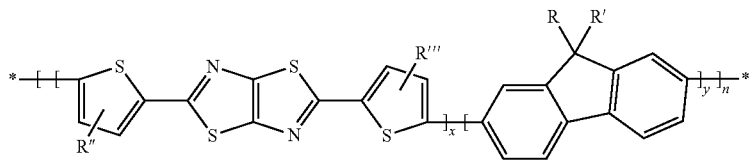
Formula S-34
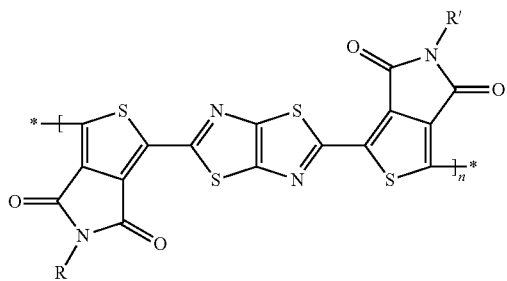
Formula S-35

-continued

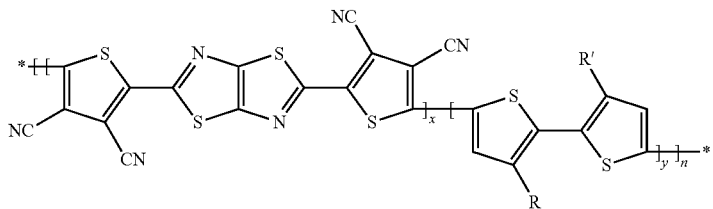
Formula S-36

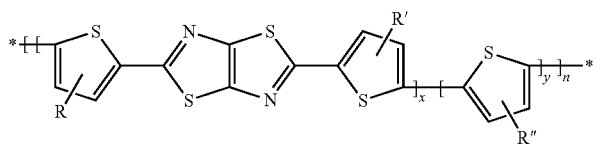
Formula S-37

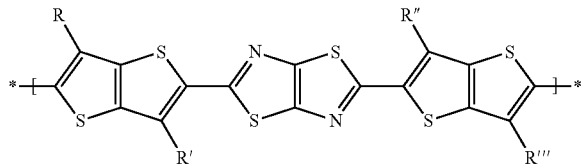
Formula S-38

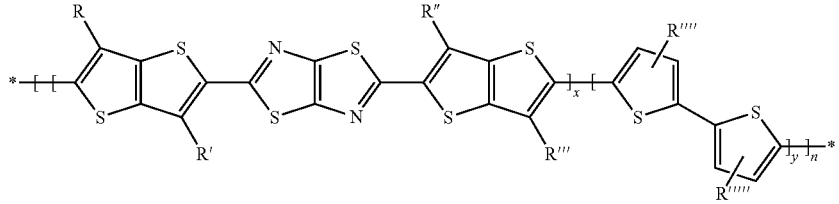
Formula S-39

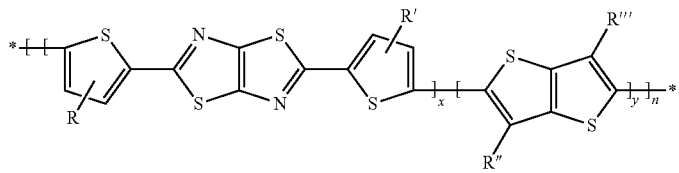
Formula S-40

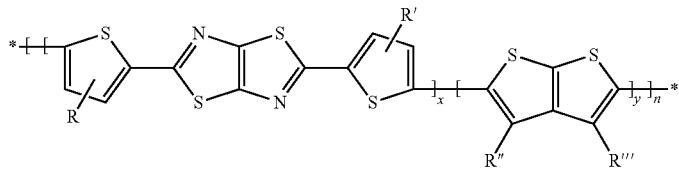
Formula S-41 wherein R to R'''' of the above Formulae are the same as or different from each other, and are independently a hydrogen atom, an oxygen atom, a halogen atom, a nitrile group, an ester group, an ether group, an amino group, an imide group, a silane group, a thioester group, a substituted or unsubstituted and linear, branched, or cyclic alkyl group having 1 to 20 carbon atoms, a substituted or unsubstituted and linear, branched, or cyclic alkoxy group having 1 to 20 carbon atoms, a substituted or unsubstituted and linear, branched, or cyclic thioalkoxy group having 1 to 20 carbon atoms, a substituted or unsubstituted aryl group, or a substituted or unsubstituted heteroaryl group.

11. The organic transistor as set forth in claim 1, wherein the organic semiconductor polymer and the conductive particles are contained in the organic semiconductor layer at a weight ratio in the range of 10:1 to 1:10,000.

* * * * *